(12) United States Patent
Tran et al.

(10) Patent No.: US 9,355,734 B2
(45) Date of Patent: May 31, 2016

(54) SENSING CIRCUITS FOR USE IN LOW POWER NANOMETER FLASH MEMORY DEVICES

(71) Applicant: Silicon Storage Technology, Inc., San Jose, CA (US)

(72) Inventors: Hieu Van Tran, San Jose, CA (US); Hung Quoc Nguyen, Fremont, CA (US); Anh Ly, San Jose, CA (US); Thuan Vu, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/196,839

(22) Filed: Mar. 4, 2014

(65) Prior Publication Data

US 2015/0255165 A1 Sep. 10, 2015

(51) Int. Cl.
*G11C 11/34* (2006.01)
*G11C 16/28* (2006.01)
*G11C 11/16* (2006.01)
*G11C 13/00* (2006.01)
*G11C 7/06* (2006.01)

(52) U.S. Cl.
CPC .............. *G11C 16/28* (2013.01); *G11C 7/065* (2013.01); *G11C 11/1673* (2013.01); *G11C 13/004* (2013.01)

(58) Field of Classification Search
CPC .. G11C 13/004; G11C 11/1673; G11C 16/28; G11C 7/06; G11C 7/062; G11C 7/065; G11C 2013/0054; G11C 16/26; G11C 2013/0042; G11C 11/4091; G11C 11/5642
USPC ............ 365/185.21, 185.2, 185.22, 154, 174, 365/189.011, 189.15, 189.05, 190, 196, 365/202, 203, 205, 207
See application file for complete search history.

(56) References Cited

U.S. PATENT DOCUMENTS

| 8,072,815 | B2 | 12/2011 | Tran |
| 8,928,406 | B2* | 1/2015 | Albinet .................... 330/253 |
| 2010/0054018 | A1* | 3/2010 | Kajigaya ............ G11C 11/005 365/148 |
| 2011/0026346 | A1 | 2/2011 | La Rosa |
| 2012/0155177 | A1* | 6/2012 | Wang et al. ............. 365/185.17 |
| 2012/0286763 | A1* | 11/2012 | Matsumoto ............ B82Y 10/00 324/72 |
| 2014/0056089 | A1 | 2/2014 | Vimercati |
| 2014/0269118 | A1* | 9/2014 | Taylor ................. H03F 3/45179 365/193 |

OTHER PUBLICATIONS

PCT Search Report dated May 20, 2015 corresponding to the related PCT Patent Application No. US2015/015919.

* cited by examiner

*Primary Examiner* — Fernando Hidalgo
(74) *Attorney, Agent, or Firm* — DLA Piper LLP (US)

(57) ABSTRACT

Improved sensing circuits for use in low power nanometer flash memory devices are disclosed.

26 Claims, 18 Drawing Sheets

SENSING CIRCUITS FOR USE IN LOW POWER NANOMETER FLASH MEMORY DEVICES

TECHNICAL FIELD

Improved sensing circuits for use in low power nanometer flash memory devices are disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

One prior art non-volatile memory cell 10 is shown in FIG. 1. The split gate SuperFlash (SF) memory cell 10 comprises a semiconductor substrate 1 of a first conductivity type, such as P type. The substrate 1 has a surface on which there is formed a first region 2 (also known as the source line SL) of a second conductivity type, such as N type. A second region 3 (also known as the drain line) also of a second conductivity type, such as N type, is formed on the surface of the substrate 1. Between the first region 2 and the second region 3 is a channel region 4. A bit line (BL) 9 is connected to the second region 3. A word line (WL) 8 (also referred to as the select gate) is positioned above a first portion of the channel region 4 and is insulated therefrom. The word line 8 has little or no overlap with the second region 3. A floating gate (FG) 5 is over another portion of the channel region 4. The floating gate 5 is insulated therefrom, and is adjacent to the word line 8. The floating gate 5 is also adjacent to the first region 2. A coupling gate (CG) 7 (also known as control gate) is over the floating gate 5 and is insulated therefrom. An erase gate (EG) 6 is over the first region 2 and is adjacent to the floating gate 5 and the coupling gate 7 and is insulated therefrom. The erase gate 6 is also insulated from the first region 2.

One exemplary operation for erase and program of prior art non-volatile memory cell 10 is as follows. The cell 10 is erased, through a Fowler-Nordheim tunneling mechanism, by applying a high voltage on the erase gate EG 6 with other terminals equal to zero volt. Electrons tunnel from the floating gate FG 5 into the erase gate EG 6 causing the floating gate FG 5 to be positively charged, turning on the cell 10 in a read condition. The resulting cell erased state is known as '1' state. Another embodiment for erase is by a applying a positive voltage Vegp on the erase gate EG 6, a negative voltage Vcgn on the coupling gate CG 7, and others terminal equal to zero volts. The negative voltage Vcgn couples negatively the floating gate FG 5, hence less positive voltage Vcgp is required for erasing. Electrons tunnel from the floating gate FG 5 into the erase gate EG 6 causing the floating gate FG 5 to be positively charged, turning on the cell 10 in a read condition (cell state '1'). Alternately the wordline WL 8 (Vwle) and the source line SL 2 (Vsle) can be negative to further reduce the positive voltage on the erase gate FG 5 needed for erase. The magnitude of negative voltage Vwle and Vsle in this case is small enough not to forward the p/n junction. The cell 10 is programmed, through a source side hot electron programming mechanism, by applying a high voltage on the coupling gate CG 7, a high voltage on the source line SL 2, a medium voltage on the erase gate EG 6, and a programming current on the bit line BL 9. A portion of electrons flowing across the gap between the word line WL 8 and the floating gate FG 5 acquire enough energy to inject into the floating gate FG 5 causing the floating gate FG 5 to be negatively charged, turning off the cell 10 in read condition. The resulting cell programmed state is known as '0' state.

The cell 10 can be inhibited in programming (if, for instance, another cell in its row is to be programmed but cell 10 is to not be programmed) by applying an inhibit voltage on the bit line BL 9. A split gate flash memory operation and various circuitry are described in U.S. Pat. No. 7,990,773, "Sub Volt Flash Memory System," by Hieu Van Tran, et al, and U.S. Pat. No. 8,072,815, "Array of Non-Volatile Memory Cells Including Embedded Local and Global Reference Cells and Systems," by Hieu Van Tran, et al, which are incorporated herein by reference.

FIG. 2 depicts a typical prior art architecture for a two-dimensional prior art flash memory system. Die 12 comprises: memory array 15 and memory array 20 for storing data, the memory array optionally utilizing memory cell 10 as in FIG. 1; pad 35 and pad 80 for enabling electrical communication between the other components of die 12 and, typically, wire bonds (not shown) that in turn connect to pins (not shown) or package bumps that are used to access the integrated circuit from outside of the packaged chip; high voltage circuit 75 used to provide positive and negative voltage supplies for the system; control logic 70 for providing various control functions, such as redundancy and built-in self-testing; analog logic 65; sensing circuits 60 and 61 used to read data from memory array 15 and memory array 20, respectively; row decoder circuit 45 and row decoder circuit 46 used to access the row in memory array 15 and memory array 20, respectively, to be read from or written to; column decoder 55 and column decoder 56 used to access the column in memory array 15 and memory array 20, respectively, to be read from or written to; charge pump circuit 50 and charge pump circuit 51, used to provide increased voltages for program and erase operations for memory array 15 and memory array 20, respectively; high voltage driver circuit 30 shared by memory array 15 and memory array 20 for read and write (erase/program) operations; high voltage driver circuit 25 used by memory array 15 during read and write operations and high voltage driver circuit 26 used by memory array 20 during read and write (erase/program) operations; and bitline inhibit voltage circuit 40 and bitline inhibit voltage circuit 41 used to un-select bitlines that are not intended to be programmed during a write operation for memory array 15 and memory array 20, respectively. These functional blocks are understood by those of ordinary skill in the art, and the block layout shown in FIG. 2 is known in the prior art.

FIG. 3 depicts a prior art sensing circuit 100. Sensing circuit 100 is an example of the type of circuit that can be used as sensing circuits 60 and 61 in FIG. 2. Sensing circuit 100 comprises memory data read block 110, memory reference read block 120, and differential amplifier block 130.

Memory data read block 110 in this example comprises current source 111, cascoding sensing NMOS transistor 113, bitline clamp NMOS transistor 114, and diode connected sensing load PMOS transistor 112.

Memory reference read block 120 in this example comprises current source 121, reference bitline clamp NMOS transistor 124, cascoding sensing NMOS transistor 123, and diode connected sensing load PMOS transistor 122.

Differential amplifier block 130 in this example comprises input differential pair NMOS transistor 131 and 134, current mirror load PMOS transistor 132 and 133, output PMOS transistor 135, current bias NMOS transistor 136, output current bias NMOS transistor 137, and output 140.

Node 116 is coupled to the selected memory cell (not shown) to be read, and node 117 is coupled to the reference memory cell (not shown) to be used to determine the value of the selected memory cell, or alternatively, a non-memory cell reference bias such as from a replica bias such as from a band-gap or other reference circuit with appropriate compensation to the design or process environment errors is used to determine the value of the selected memory cell.

Differential amplifier block 130 is used to compare the signals received from memory data read block 110 and memory reference read block 120 to generate output 140 which indicates the value of the data stored in the selected memory cell. These components are connected to one another as shown in FIG. 3.

During operation, differential amplifier block 130 will compare the current drawn by memory data read block 110 (through the node 116) and memory reference read block 120 (through the node 117) to generate output 140. If the current drawn by memory data read block 110 exceeds the reference current drawn from memory reference read block 120 (signifying that a "1" is stored in the selected memory cell), then output 140 will be high. If the current drawn from memory data read block 110 is less than the current drawn from memory reference read block 120 (signifying that a "0" is stored in the selected memory cell), then output 140 will be low.

Sensing circuit 100 typically requires an operating voltage of 1.8-3.3 volts. As the size of flash memory cells and arrays diminish in size, what is needed is an improvement to sensing circuit 100 that can function with a lower operating voltage (such as <1.1 volts) and lower power consumption. What is further needed is a sensing circuit that can compensate for non-idealities such as transistor mismatch and memory array mismatch.

SUMMARY OF THE INVENTION

Several embodiments are described herein to provide a lower power, lower voltage sensing circuit. The embodiments compensate for non-idealities such as transistor mismatch and memory array mismatch using a variety of techniques.

DETAILED DESCRIPTION OF THE PREFERRED EMBODIMENTS

Figure 4:
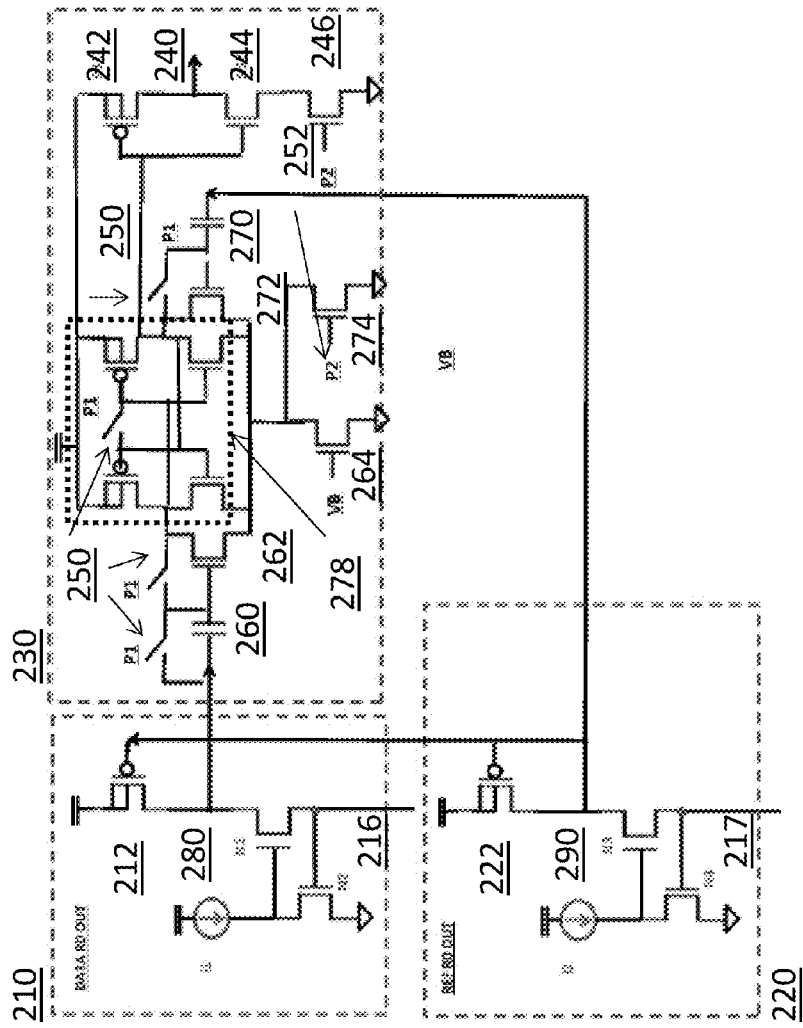
FIG. 4 depicts a first embodiment of a sensing circuit for use with a flash memory array.

With reference to FIG. 4, an embodiment is depicted. Sensing circuit 200 compensates for transistor mismatching and array mismatching. Sensing circuit 200 comprises memory data read block 210, memory reference read block 220, and differential amplifier block 230. Many of the components of memory data read block 210 are the same as those of memory data read block 110, and such components will not be described here. Similarly, many of the components of memory reference read block 220 are the same as those of memory reference read block 120 and will not be described here. The memory differential amplifier block 230 includes an input NMOS transistor pair 262 and 272 biased by a bias NMOS transistor 264. The gates of the input pair 262 and 272 are connected to the terminals of the capacitor 260 and 270 respectively. The amplifier block 230 also includes a cross coupled inverter pair 278 with its source (virtual ground) biased by the NMOS 264. The outputs of the cross coupled inverter pair is connected to the drains of the input transistors 262 and 272. The memory differential amplifier block 230 includes an output stage consisting of transistor 242, 244 and 246. A transistor 274 with drain connected to the drain of the transistor 264 and its gate enabled by a sensing signal P2 252. The devices are connected as shown in FIG. 4. Transistor 212 of the memory data read block 210, instead of diode connected, mirrors the reference current from transistor 222 of the memory reference read block 220 and compares versus the data current coupled through the node 216. The comparison result is outputted on node 280.

Unlike in the prior art, differential amplifier block 230 is decoupled from memory data read block 210 and memory reference read block 220. Specifically, one input of differential amplifier block 230 is connected to capacitor 260, which in turn is coupled to memory data read block 210, specifically to the output node 280, and the other input of the differential amplifier block 230 is coupled to capacitor 270, which in turn is coupled to memory reference read block 220, specifically to output node 290 of diode connected transistor 222. This enables the system to precharge differential amplifier block 230 independent of memory data read block 210 and memory reference read block 220. An exemplary value for capacitor 260 is 5 fF-80 fF, and an exemplary value for capacitor 270 is 5 fF-80 fF.

During a precharge phase, switches 250 are turned on prior to the sensing comparing operation. This ensures that the portion of differential amplifier block 230 coupled to capacitor 260 is charged to the same voltage level as the portion of differential amplifier block 230 coupled to capacitor 270. This can be considered an act of preamplification for differential amplifier block 230. This also acts effectively to auto-zero (cancel) the offset of the differential amplifier block 230, i.e., it stores the offset on the capacitor during precharge phase and cancel it during sensing phase.

During the sensing phase, switches 250 are turned off, and sequentially the signal 252 will be turned on. The voltage at sensed node 280 will go up if the selected memory cell is storing a "0," and it will go down if the selected memory cell is storing a "1." Reference node 290 will remain at a voltage level that is approximately midway between a high level of sensed node 280 and a low level of sensed node 280. Differential amplifier 230 will then compare sensed node 280 and reference node 290 through its voltage coupling through the capacitor 260 and 270 respectively, and the result will emerge at output 240. If selected memory cell stores a "0," then output 240 will be low. If selected memory cell stores a "1," then output 240 will be high. The cross coupled inverter pair 278 serves to feedback positively during the sensing phase to accelerate the sensing time. The transistor 274 serves to increase the sensing time through adding the tail bias current in parallel to that of the transistor 264 and also serves to provide the gnd (~0 v) level to the cross coupled inverter pair 278 and hence its outputs.

One benefit of this embodiment is that transistor mismatching is alleviated through the use of a common initial state within differential amplifier 230 established through the precharge phase and the decoupling enabled by capacitor 260 and capacitor 270. In addition, the decoupling allows memory data read block 210 to use a higher bit line current than would be possible without the decoupling. Further the power supply for the differential amplifier block 230 might be optimized (or decoupled) at a different level than that of the power supply of the memory data read block 210 and the memory reference read block 220.

Figure 5:
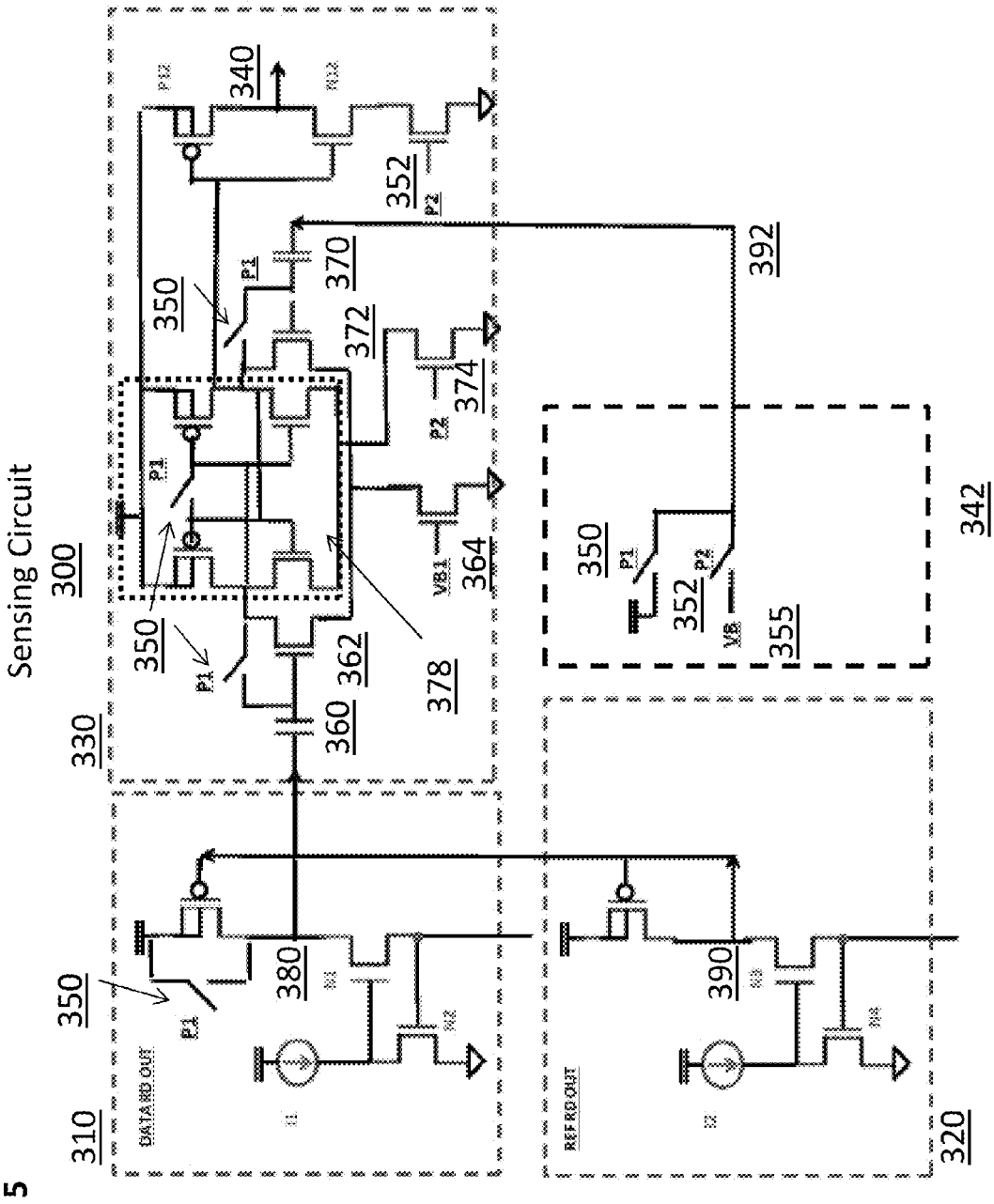
FIG. 5 depicts a second embodiment of a sensing circuit for use with a flash memory array.

With reference to FIG. 5, an embodiment is depicted. Sensing circuit 300 compensates for transistor mismatching and array mismatching. Sensing circuit 300 comprises memory data read block 310, memory reference read block 320, and differential amplifier block 330. Many of the components of memory data read block 310, memory reference read block 320, and differential amplifier block 330 are the same as those of blocks described in the previous embodiment and will not be described here. The devices are connected as shown in FIG. 5.

Sensing circuit 300 is similar to sensing circuit 200. Differential amplifier block 330 is decoupled from memory data read block 310 and memory reference read block 320. Specifically, differential amplifier block 330 is connected to capacitor 360, which in turn is connected to memory data read block 310, and differential amplifier block 330 is connected to capacitor 370, which in turn is connected to reference read bias block 342. This enables the system to precharge differential amplifier block 330 independent of memory data read block 310 and memory reference read block 320. An exemplary value for capacitor 360 is 5 fF-80 fF, and an exemplary value for capacitor 370 is 5 fF-80 fF. The differential amplifier block 330 includes a cross coupled inverter pair 378 biased from a transistor 374 through its source (virtual ground). It includes an input pair transistor 363 and 372 biased from a bias transistor 364 which is different (de coupled) from the bias transistor 374. The gates of the input pair 362 and 372 are connected to the terminals of the capacitor 360 and 370 respectively During a precharge phase, switches 350 are turned on prior to the sensing operation. This ensures that the portion of differential amplifier block 330 coupled to capacitor 360 is charged to the same voltage level as the portion of differential amplifier block 330 coupled to capacitor 370. This can be considered an act of preamplification for differential amplifier block 330. This also acts to effectively auto-zero the offset of the amplifier block 330. The placement of switches 350 in sensing circuit 300 is slightly different than that of switches 250 in sensing circuit 200. Specifically, one of the switches 350 couples sensed node 380 and 290 directly to the VDD power supply. Thus, at the beginning of the sensing phase, sensed node 380 will be at VDD. An exemplary value for VDD is 1.1 volts.

During the sensing phase, switches 350 are turned off. The voltage at sensed node 380 will go down if the selected memory cell is storing a "0," and it will go down even further if the selected memory cell is storing a "1." Reference node 392 will be switched by signal 352 to at a voltage level 355 that is approximately midway between a high level of sensed node 380 and a low level of sensed node 380. Differential amplifier 330 will then compare sensed node 380 and reference bias node 392 through its voltage coupling through the capacitor 360 and 370 respectively, and the result will emerge at output 340. If selected memory cell stores a "0," then output 340 will be low. If selected memory cell stores a "1," then output 340 will be high.

One benefit of this embodiment is that transistor mismatching is alleviated through the use of a common initial state within differential amplifier 330 established through the precharge phase and the decoupling enabled by capacitor 360 and capacitor 370. In addition, the decoupling allows memory data read block 310 to use a higher bit line current than would be possible without the decoupling. Further the power supply for the differential amplifier block 330 might be optimized (or decoupled) at a different level than that of the power supply of the memory data read block 310 and the memory reference read block 320

Figure 6:
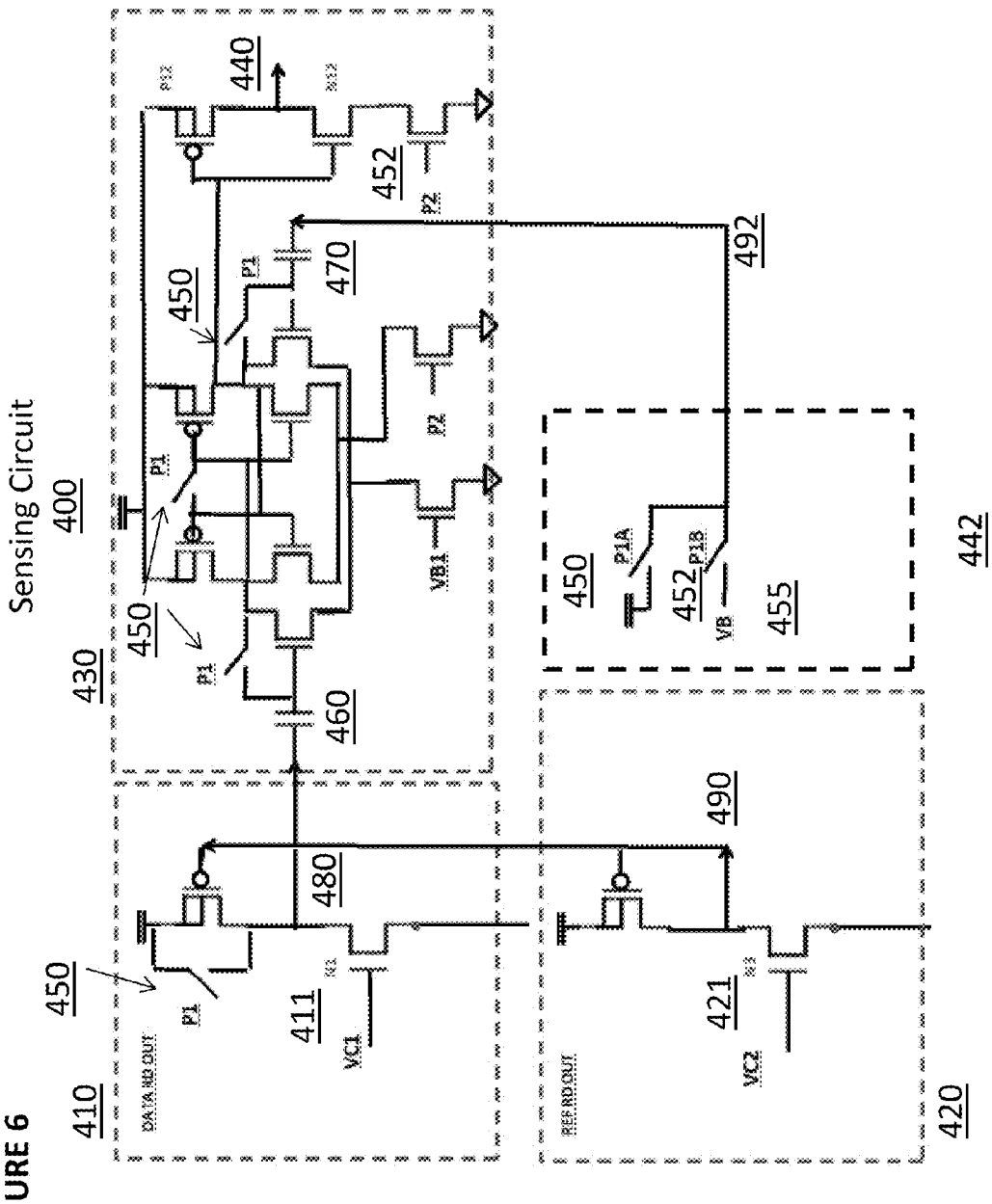
FIG. 6 depicts a third embodiment of a sensing circuit for use with a flash memory array.

With reference to FIG. 6, an embodiment is depicted. Sensing circuit 400 compensates for transistor mismatching and array mismatching. Sensing circuit 400 comprises memory data read block 410, memory reference read block 420, and differential amplifier block 430. Many of the components of memory data read block 410, memory reference read block 420, and differential amplifier block 430 are the same as those of blocks described in previous embodiments and will not be described here. The devices are connected as shown in FIG. 6.

Figure 1:
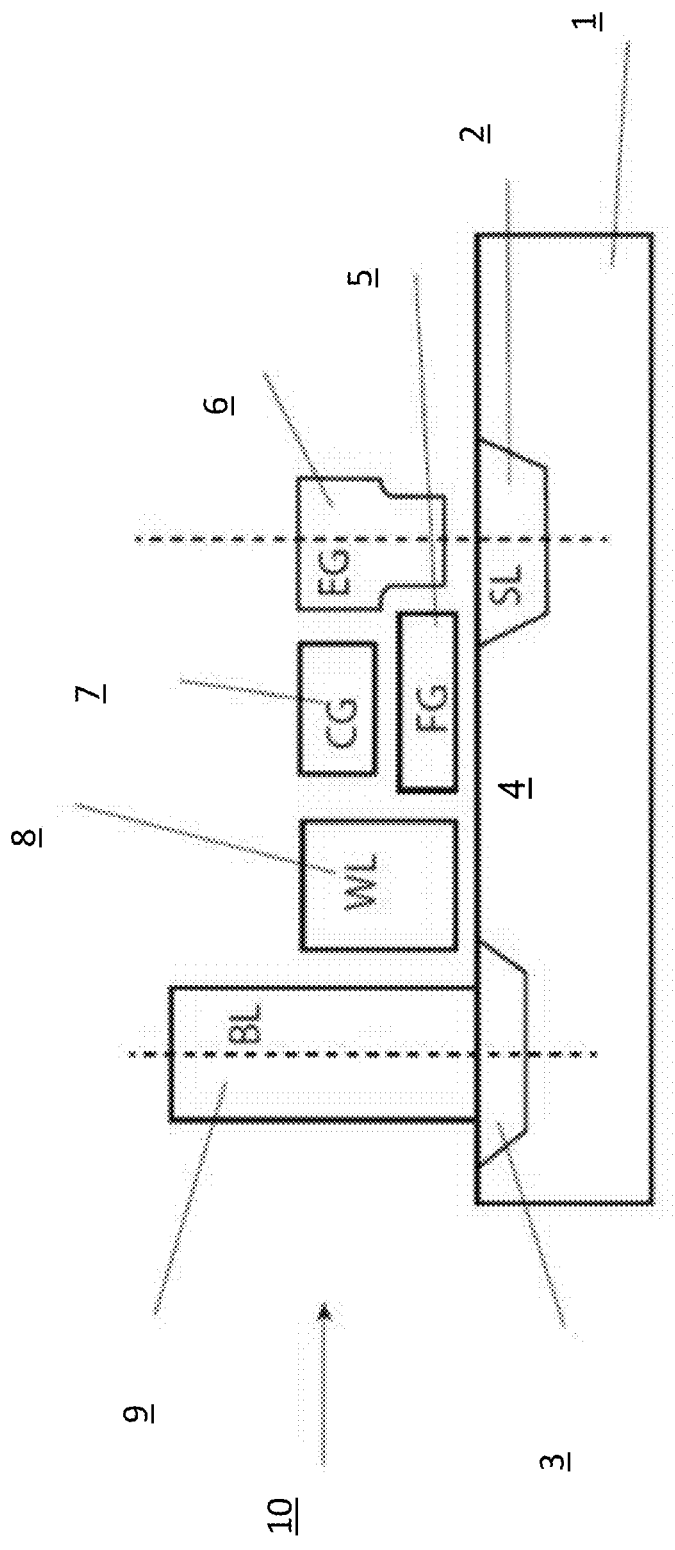
FIG. 1 depicts a prior art split gate flash memory cell.
Figure 2:
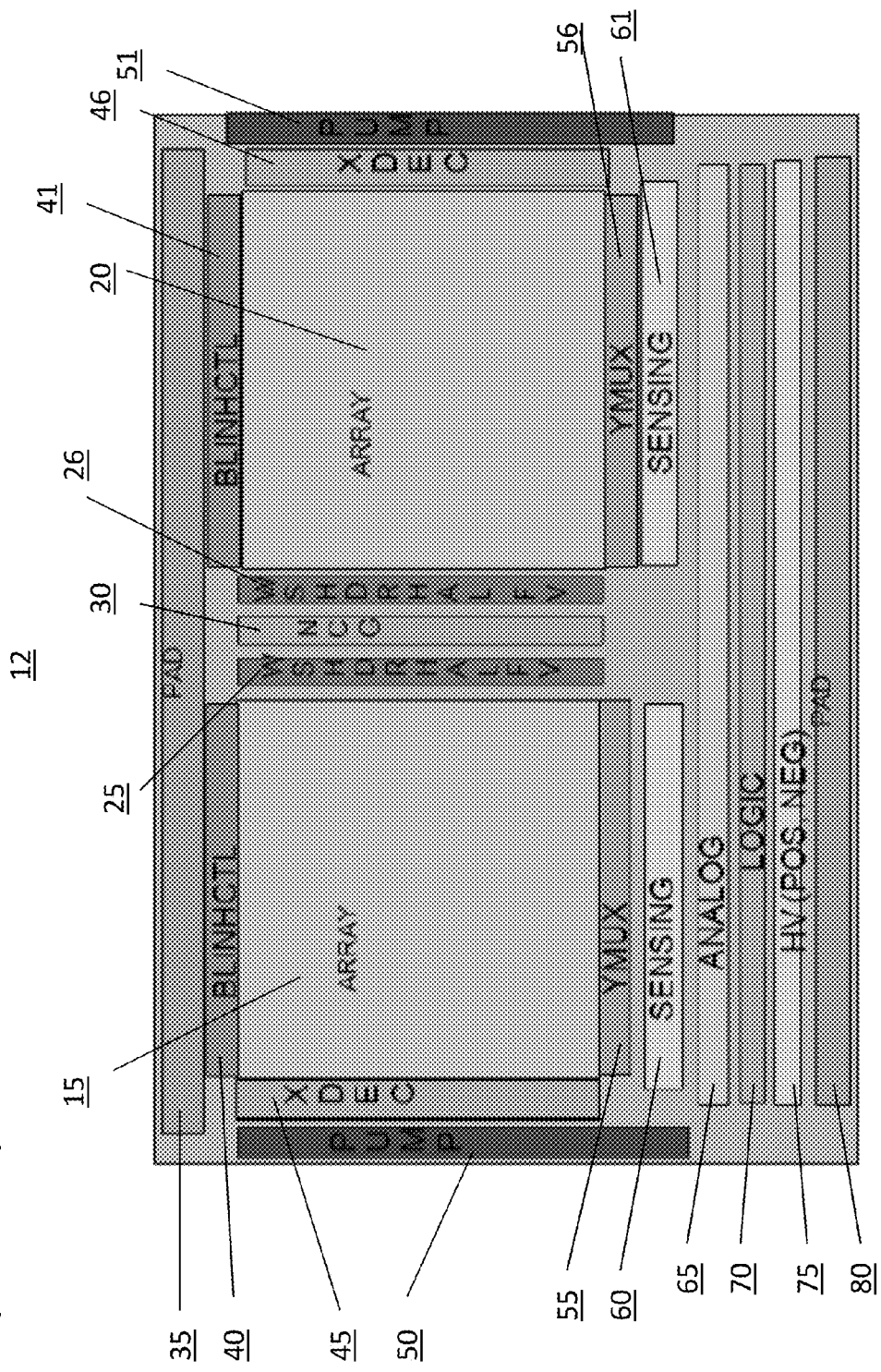
FIG. 2 depicts a layout of a prior art flash memory array.
Figure 3:
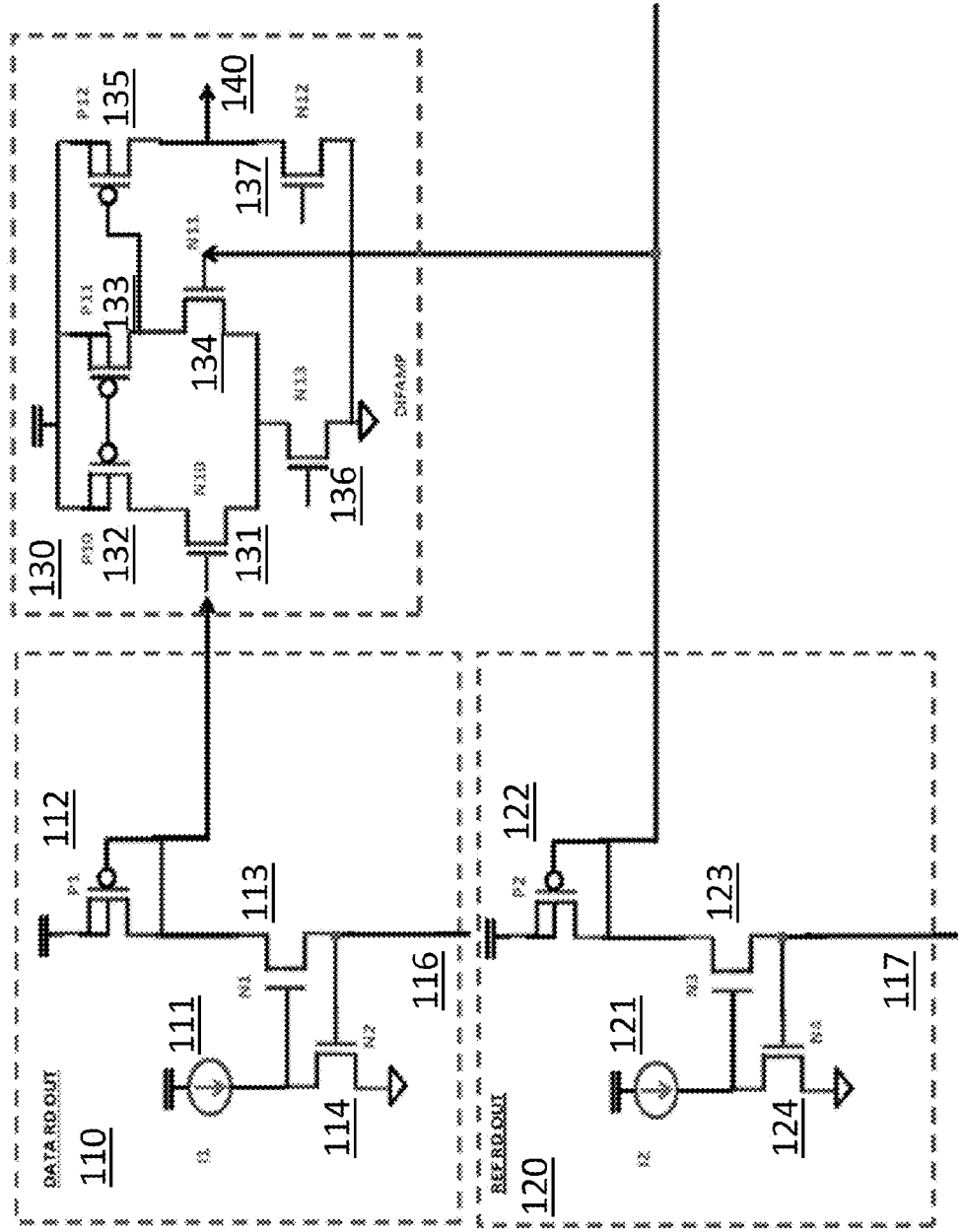
FIG. 3 depicts a prior art sensing circuit for use with a flash memory array.

One difference in sensing circuit 400 compared to sensing circuit 300 is that memory data read block 410 does not have a current source such as current source 111 shown in FIG. 3 and subsequent figures, and memory reference read block 420 does not have a current source such as current source 121 shown in FIG. 3 and subsequent figures. Instead, the gate of cascoding sensing NMOS transistor 411 is connected to a bias voltage source of voltage VC1, and the gate of cascoding sensing NMOS transistor 42 is connected to a bias voltage source of voltage VC2. An exemplary value for VC1 is 0.6-1.5V, and an exemplary value for VC2 is 0.6-1.5V. The effect of these differences is that sensing circuit 400 consumes less power than sensing circuit 300.

Differential amplifier block 430 is decoupled from memory data read block 410 and memory reference read block 420. Specifically, differential amplifier block 430 is connected to capacitor 460, which in turn is connected to memory data read block 410, and differential amplifier block 430 is connected to capacitor 470, which in turn is connected to reference read bias block 442. This enables the system to precharge differential amplifier block 430 independent of memory data read block 410 and memory reference read block 420. An exemplary value for capacitor 460 is 5 fF-80 fF, and an exemplary value for capacitor 470 is 5 fF-80 fF.

During a precharge phase, switches 450 are turned on prior to the sensing operation. This ensures that the portion of differential amplifier block 430 coupled to capacitor 460 is charged to the same voltage level as the portion of differential amplifier block 430 coupled to capacitor 470. This can be considered an act of preamplification for differential amplifier block 430. One of the switches 450 couples sensed node 480 directly to the VDD power supply. Thus, at the beginning of the sensing phase, sensed node 480 will be at VDD. An exemplary value for VDD is 1.1 volts.

During the sensing phase, switches 450 are turned off. The voltage at sensed node 480 will go down if the selected memory cell is storing a "0," and it will go down even further if the selected memory cell is storing a "1." Reference node 492 will be switched at a voltage level 455 that is approximately midway between a high level of sensed node 480 and a low level of sensed node 480. Differential amplifier 430 will then compare sensed node 480 and reference bias node 492 through its voltage coupling through the capacitor 460 and 470 respectively, and the result will emerge at output 440. If selected memory cell stores a "0," then output 440 will be low. If selected memory cell stores a "1," then output 440 will be high.

One benefit of this embodiment is that transistor mismatching is alleviated through the use of a common initial state within differential amplifier 430 established through the precharge phase and the decoupling enabled by capacitor 460 and capacitor 470. In addition, the decoupling allows memory data read block 410 to use a higher bit line current than would be possible without the decoupling.

Figure 7:
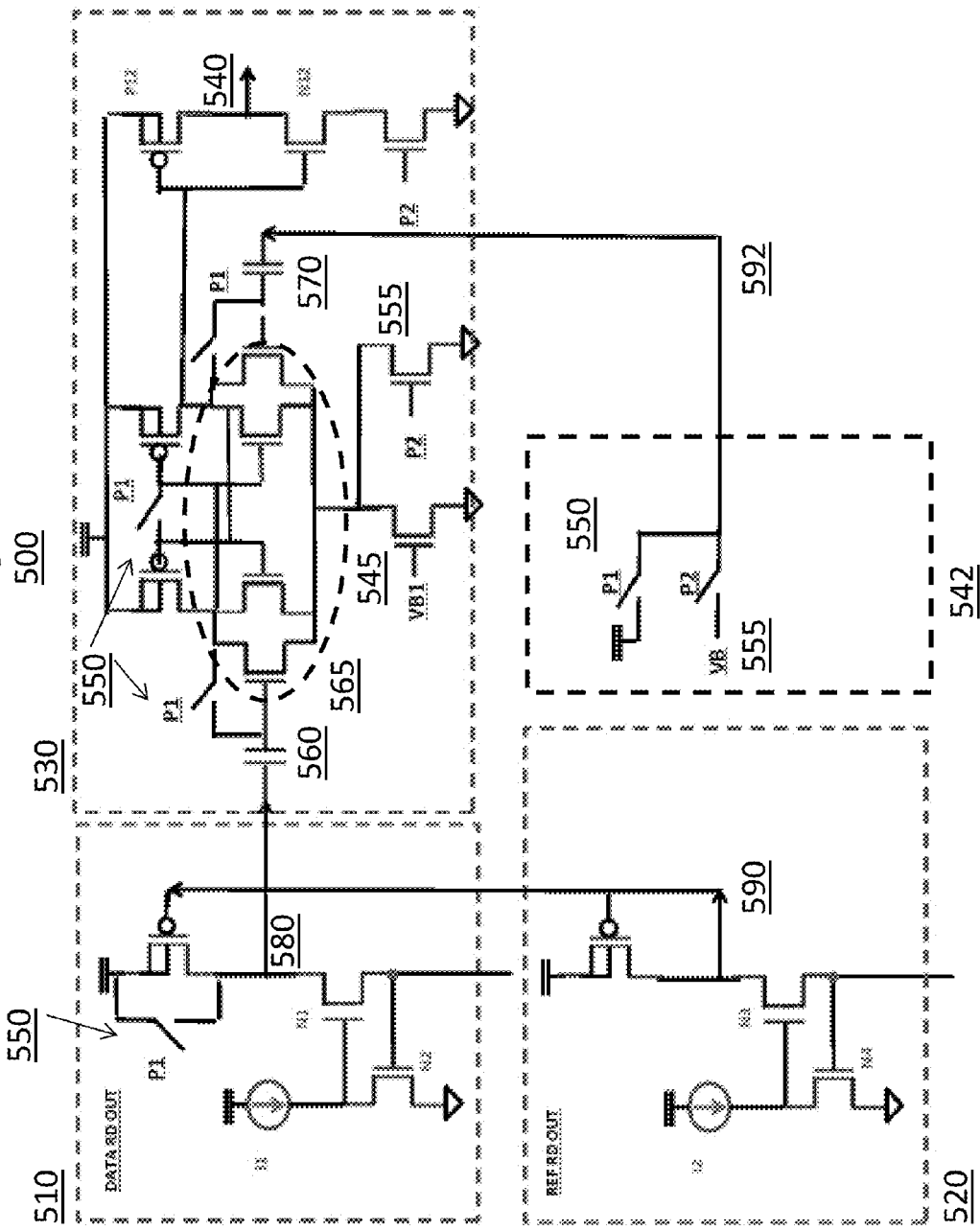
FIG. 7 depicts a fourth embodiment of a sensing circuit for use with a flash memory array.

With reference to FIG. 7, another embodiment is depicted. Sensing circuit 500 compensates for transistor mismatching and array mismatching. Sensing circuit 500 comprises memory data read block 510, memory reference read block 520, and differential amplifier block 530. Many of the components of memory data read block 510, memory reference read block 520, and differential amplifier block 530 are the same as those of blocks described in previous embodiments and will not be described here. The devices are connected as shown in FIG. 7.

One difference in sensing circuit 500 compared to sensing circuit 400 is that the source of NMOS transistor 545 and the source of NMOS transistor 555 are tied to each other and to the drains of the cross-coupled inverter block 565.

Differential amplifier block 530 is decoupled from memory data read block 510 and memory reference read block 520. Specifically, differential amplifier block 530 is connected to capacitor 560, which in turn is connected to memory data read block 510, and differential amplifier block 530 is connected to capacitor 570, which in turn is connected to memory reference read bias block 542. This enables the system to precharge differential amplifier block 530 independent of memory data read block 510 and memory reference read block 520. An exemplary value for capacitor 560 is 5 fF-80 fF, and an exemplary value for capacitor 570 is 5 fF-80 fF.

During a precharge phase, switches 550 are turned on prior to the sensing operation. This ensures that the portion of differential amplifier block 530 coupled to capacitor 560 is charged to the same voltage level as the portion of differential amplifier block 530 coupled to capacitor 570. This can be considered an act of preamplification for differential amplifier block 530. One of the switches 550 couples sensed node 580 directly to the VDD power supply. Thus, at the beginning of the sensing phase, sensed node 580 will be at VDD. An exemplary value for VDD is 1.1 volts.

During the sensing phase, switches 550 are turned off. The voltage at sensed node 580 will go down if the selected memory cell is storing a "0," and it will go down even further if the selected memory cell is storing a "1." Reference node 592 will be switched at a voltage level 555 that is approximately midway between a high level of sensed node 580 and a low level of sensed node 580. Differential amplifier 530 will then compare sensed node 580 and reference node 592 through its voltage coupling through the capacitor 560 and 570 respectively, and the result will emerge at output 540. If selected memory cell stores a "0," then output 540 will be low. If selected memory cell stores a "1," then output 540 will be high.

One benefit of this embodiment is that transistor mismatching is alleviated through the use of a common initial state within differential amplifier 530 established through the precharge phase and the decoupling enabled by capacitor 560 and capacitor 570. In addition, the decoupling allows memory data read block 510 to use a higher bit line current than would be possible without the decoupling.

Figure 8:
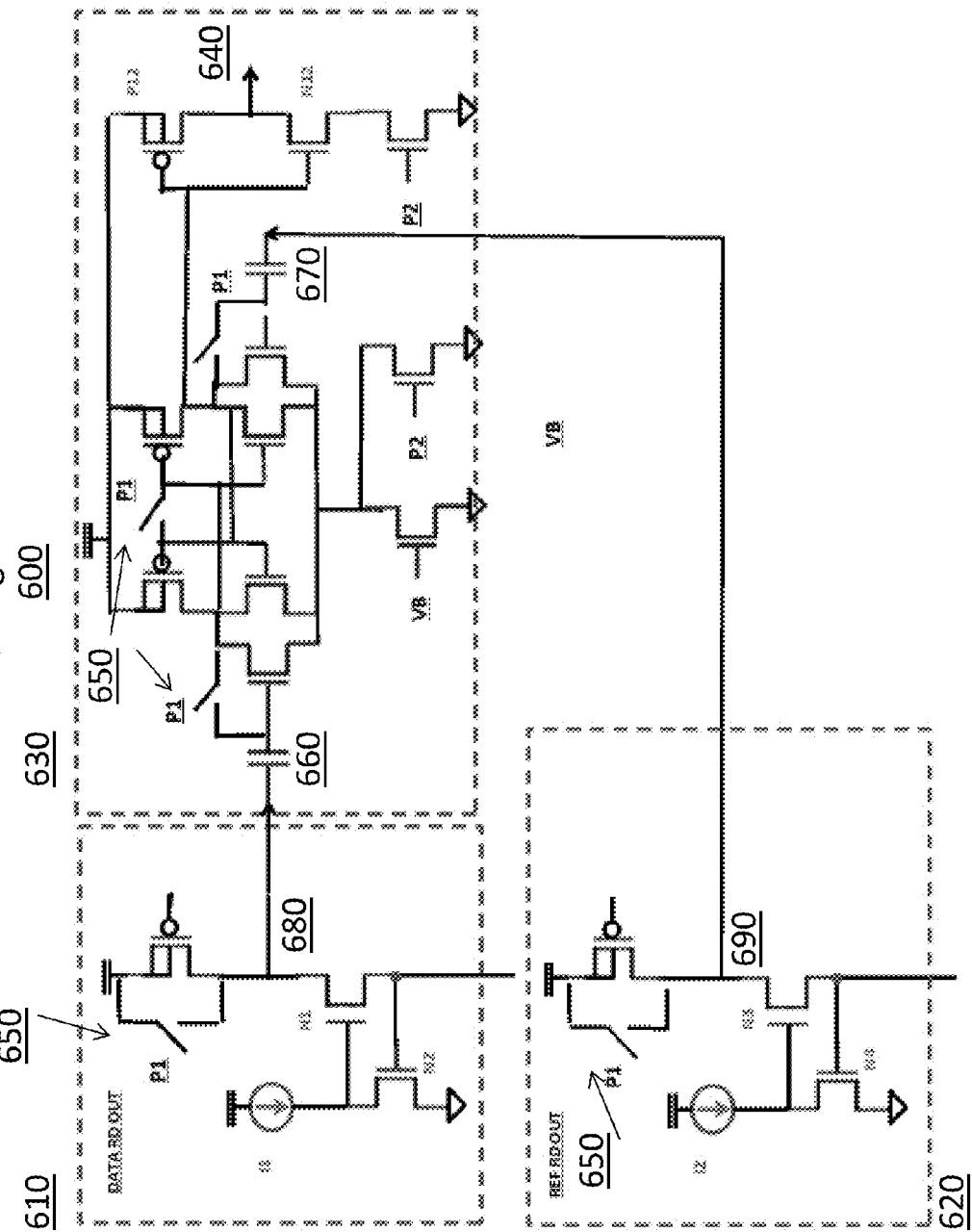
FIG. 8 depicts a fifth embodiment of a sensing circuit for use with a flash memory array.

With reference to FIG. 8, another embodiment is depicted. Sensing circuit 600 compensates for transistor mismatching and array mismatching. Sensing circuit 600 comprises memory data read block 610, memory reference read block 620, and differential amplifier block 630. Many of the components of memory data read block 610, memory reference read block 620, and differential amplifier block 630 are the same as those of blocks described in previous embodiments and will not be described here. The devices are connected as shown in FIG. 8.

Differential amplifier block 630 is decoupled from memory data read block 610 and memory reference read block 620. Specifically, differential amplifier block 630 is connected to capacitor 660, which in turn is connected to memory data read block 610, and differential amplifier block 630 is connected to capacitor 670, which in turn is connected to memory reference read block 620. This enables the system to precharge differential amplifier block 630 independent of memory data read block 610 and memory reference read block 620. An exemplary value for capacitor 660 is 5 fF-80 fF, and an exemplary value for capacitor 670 is 5 fF-80 fF.

During a precharge phase, switches 650 are turned on prior to the sensing operation. This ensures that the portion of differential amplifier block 630 coupled to capacitor 660 is charged to the same voltage level as the portion of differential amplifier block 630 coupled to capacitor 670. This can be considered an act of preamplification for differential amplifier block 630. One of the switches 650 couples sensed node 680 directly to the VDD power supply. Thus, at the beginning of the sensing phase, sensed node 580 will be at VDD. The sole difference between sensing circuit 600 and sensing circuit 500 is that one of the switches 650 couples reference node 690 directly to VDD. Thus, at the beginning of the sensing phase, reference node 690 also will be at VDD.

During the sensing phase, switches 650 are turned off. The voltage at sensed node 680 will go down if the selected memory cell is storing a "0," and it will go down faster and even further if the selected memory cell is storing a "1." Differential amplifier 630 will then compare sensed node 680 and reference node 690 during the ramping down of the nodes 680 and 690, and the result will emerge at output 640. If selected memory cell stores a "0," then output 640 will be low. If selected memory cell stores a "1," then output 640 will be high. Reference node 690 will ramp down to a steady state voltage level that is approximately between a high level of sensed node 680 and a low level of sensed node 680 with appropriate current or resistive load on the nodes 680 and 690.

One benefit of this embodiment is that transistor mismatching is alleviated through the use of a common initial state within differential amplifier 630 established through the precharge phase and the decoupling enabled by capacitor 660 and capacitor 670. In addition, the decoupling allows memory data read block 610 to use a higher bit line current than would be possible without the decoupling.

Figure 9:
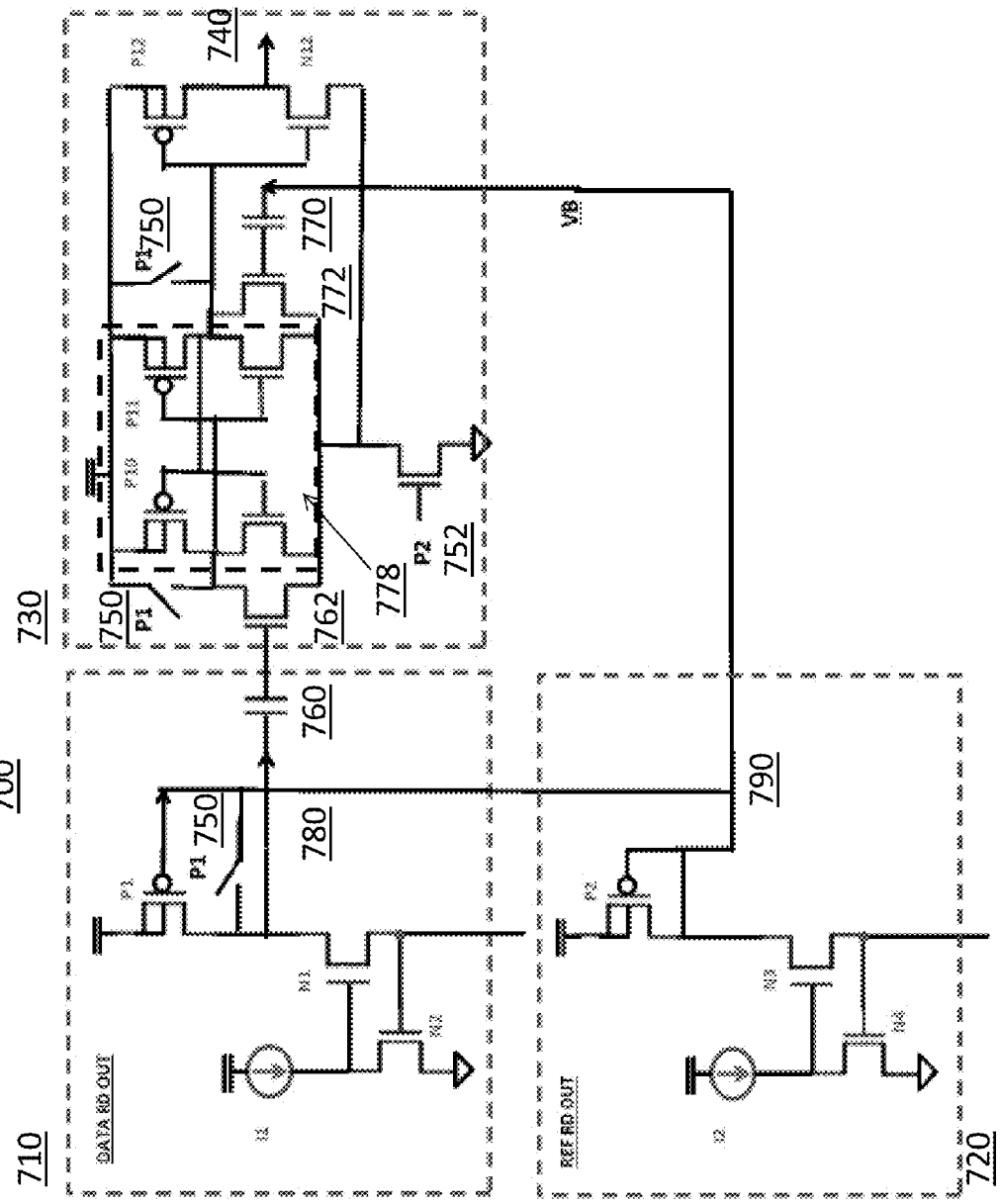
FIG. 9 depicts a sixth embodiment of a sensing circuit for use with a flash memory array.

With reference to FIG. 9, another embodiment is depicted. Sensing circuit 700 compensates for transistor mismatching and array mismatching. Sensing circuit 700 comprises memory data read block 710, memory reference read block 720, and differential amplifier block 730. Many of the components of memory data read block 710, memory reference read block 720, and differential amplifier block 730 are the same as those of blocks described in previous embodiments and will not be described here. The devices are connected as shown in FIG. 9.

Differential amplifier block 730 is decoupled from memory data read block 710 and memory reference read block 720. Specifically, differential amplifier block 730 is connected to capacitor 760, which in turn is connected to memory data read block 710, and differential amplifier block 730 is connected to capacitor 770, which in turn is connected to memory reference read block 720. This enables the system to precharge differential amplifier block 730 independent of memory data read block 710 and memory reference read block 720. An exemplary value for capacitor 760 is 5 fF-80 fF, and an exemplary value for capacitor 770 is 5 fF-80 fF.

During a precharge phase, switches 750 are turned on prior to the sensing operation. This ensures that the portion of differential amplifier block 730 coupled to capacitor 760 is charged to the same voltage level as the portion of differential amplifier block 730 coupled to capacitor 770. This can be considered an act of precharging or initialization for differential amplifier block 730. Drain of input pair 762 and 772 that couples to the capacitor 760 and 770 respectively are precharged to VDD level.

During the sensing phase, switches 750 are turned off and switch 752 are turned on. The voltage at sensed node 780 will go down if the selected memory cell is storing a "0," and it will go down even further if the selected memory cell is storing a "1." Reference node 790 will be at voltage level that is approximately midway between a high level of sensed node 780 and a low level of sensed node 780. Differential amplifier 730 will then compare sensed node 780 and reference node 790 through its voltage coupling through the capacitor 760 and 770 respectively, and the result will emerge at output 740. If selected memory cell stores a "0," then output 740 will be low. If selected memory cell stores a "1," then output 740 will be high.

One benefit of this embodiment is that transistor mismatching is alleviated through the use of a common initial state within differential amplifier 730 established through the precharge phase and the decoupling enabled by capacitor 760 and capacitor 770. In addition, the decoupling allows memory data read block 710 to use a higher bit line current than would be possible without the decoupling.

Figure 10:
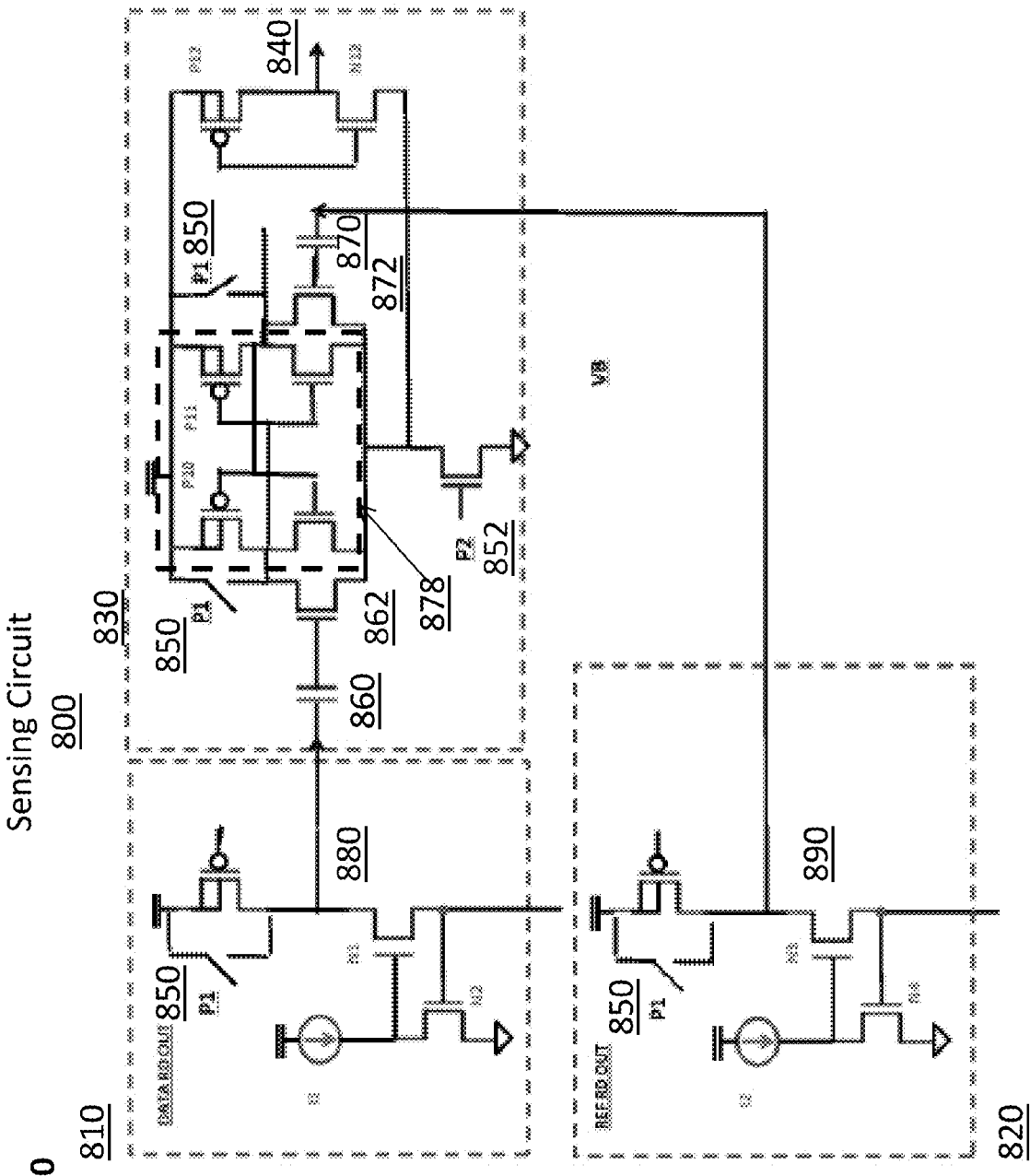
FIG. 10 depicts a seventh embodiment of a sensing circuit for use with a flash memory array.

With reference to FIG. 10, another embodiment is depicted. Sensing circuit 800 compensates for transistor mismatching and array mismatching. Sensing circuit 800 comprises memory data read block 810, memory reference read block 820, and differential amplifier block 830. Many of the components of memory data read block 810, memory reference read block 820, and differential amplifier block 830 are the same as those of blocks described in previous embodiments and will not be described here. The devices are connected as shown in FIG. 10.

Differential amplifier block 830 is decoupled from memory data read block 810 and memory reference read block 820. Specifically, differential amplifier block 830 is connected to capacitor 860, which in turn is connected to memory data read block 810, and differential amplifier block 830 is connected to capacitor 870, which in turn is connected to memory reference read block 820. This enables the system to precharge differential amplifier block 830 independent of memory data read block 810 and memory reference read block 820. An exemplary value for capacitor 860 is 5 fF-80 fF, and an exemplary value for capacitor 870 is 5 fF-80 fF. Drain of input pair 862 and 872 that couples to the capacitor 860 and 870 respectively are precharged to VDD level.

During a precharge phase, switches 850 are turned on prior to the sensing operation. This ensures that the portion of differential amplifier block 830 coupled to capacitor 860 is charged to the same voltage level as the portion of differential amplifier block 830 coupled to capacitor 870. This can be considered an act of initialization for differential amplifier block 830. One of the switches 850 connects sensed node 880 to VDD, and another of the switches 850 connects reference node 890 to VDD. Thus, at the beginning of the sensing phase, sensed node 880 and reference node 890 will both be at a voltage level of VDD. An exemplary value for VDD is 1.1 volts.

During the sensing phase, switches 850 are turned off and switch 852 is turned on. The voltage at sensed node 880 will go down if the selected memory cell is storing a "0," and it will go down even further if the selected memory cell is storing a "1." Reference node 890 will ramp down from VDD to a voltage level that is approximately midway between a high level of sensed node 880 and a low level of sensed node 880. Differential amplifier 830 will then compare sensed node 880 and reference node 890 through the capacitor 860 and 870 respectively, and the result will emerge at output 840. If selected memory cell stores a "0," then output 840 will be low. If selected memory cell stores a "1," then output 840 will be high.

One benefit of this embodiment is that transistor mismatching is alleviated through the use of a common initial state within differential amplifier 830 established through the precharge phase and the decoupling enabled by capacitor 860 and capacitor 870. In addition, the decoupling allows memory data read block 810 to use a higher bit line current than would be possible without the decoupling.

Figure 11:
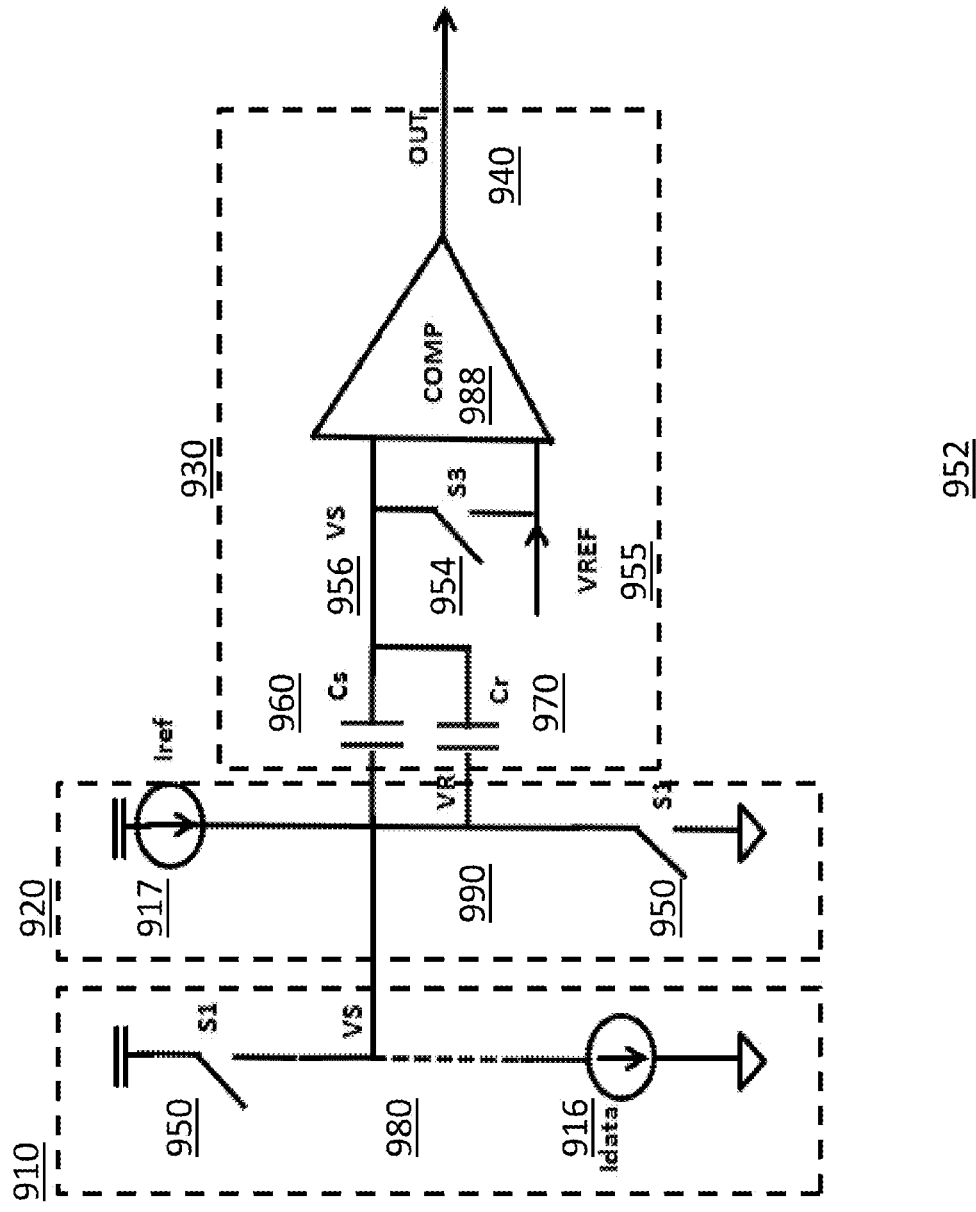
FIG. 11 depicts a seventh embodiment of a sensing circuit for use with a flash memory array.

With reference to FIG. 11, another embodiment is depicted. Sensing circuit 900 compensates for transistor mismatching and array mismatching. Sensing circuit 900 comprises memory data read block 910, memory reference read block 920, and differential amplifier block 930. The devices are connected as shown in FIG. 11. The memory data read block 910 includes a sensed node 980 coupled to a switch (to VDD) controlled by signal 950 and coupled to a memory cell current 916 to ground. The memory reference read block 920 includes a reference node 990 coupled to a switch controlled by signal 950 to ground and coupled to a memory cell current 917 to VDD.

Differential amplifier block 930 is decoupled from memory data read block 910 and memory reference read block 920. Specifically, differential amplifier block 930 is connected to capacitor 960, which in turn is connected to memory data read block 910, and differential amplifier block 930 is connected to capacitor 970, which in turn is connected to memory reference read block 920. This enables the system to operate the differential amplifier block 930 at bias level independent of memory data read block 910 and memory reference read block 920. The differential amplifier block 930 includes a comparator 988 with its output 940 and a switch 954 to initialize the comparator 988. One terminal of the differential amplifier block 930 couples to both terminals of the capacitor 960 and 970. The other terminal of the differential amplifier block 930 couples to a read reference level 955.

During a precharge phase, switches 950 and 954 are turned on prior to the sensing operation. This ensures that the portion of differential amplifier block 930 coupled to capacitor 960 is charged to the same voltage level as the portion of differential amplifier block 930 coupled to capacitor 970. This can be considered an act of initialization/autozero for differential amplifier block 930. One of the switches 850 connects sensed node 980 to VDD, and another of the switches 950 connects reference node 990 to GND. Thus, at the beginning of the sensing phase, sensed node 980 and reference node 990 will be at complementary voltage level of VDD and GND respectively.

During the sensing phase, switches 950 and 954 are turned off. The voltage at sensed node 980 will go down slowly if the selected memory cell is storing a "0," and it will go down faster and even further if the selected memory cell is storing a "1." Reference node 990 will ramp up from GND to with a ramp rate that is approximately between a high ramp rate level of sensed node 880 and a low ramp rate level of sensed node 980. The differential amplifier 930 will then compare summation at a sum node 956 of the sensed node 980 and reference node 990 through the capacitor 960 and 970 respectively versus the reference bias node 955, and the result will emerge at output 940. If selected memory cell stores a "0," then output 940 will be low. If selected memory cell stores a "1," then output 940 will be high.

One benefit of this embodiment is that transistor mismatching is alleviated through the use of a common initial state within differential amplifier 930 established through the precharge phase and the decoupling enabled by capacitor 960 and capacitor 970. In addition, the decoupling allows memory read block 910 and 920 to use a higher bit line current than would be possible without the decoupling.

Figure 12:
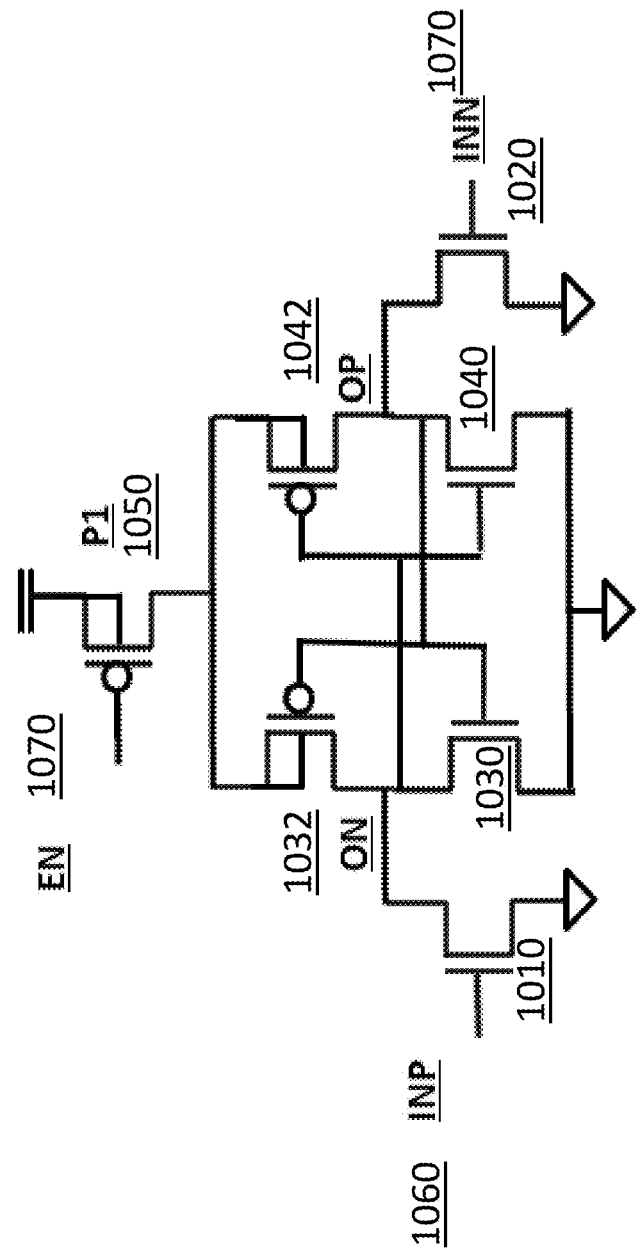
FIG. 12 depicts another embodiment of a comparator circuit for use with a flash memory array sensing.
Figure 13:
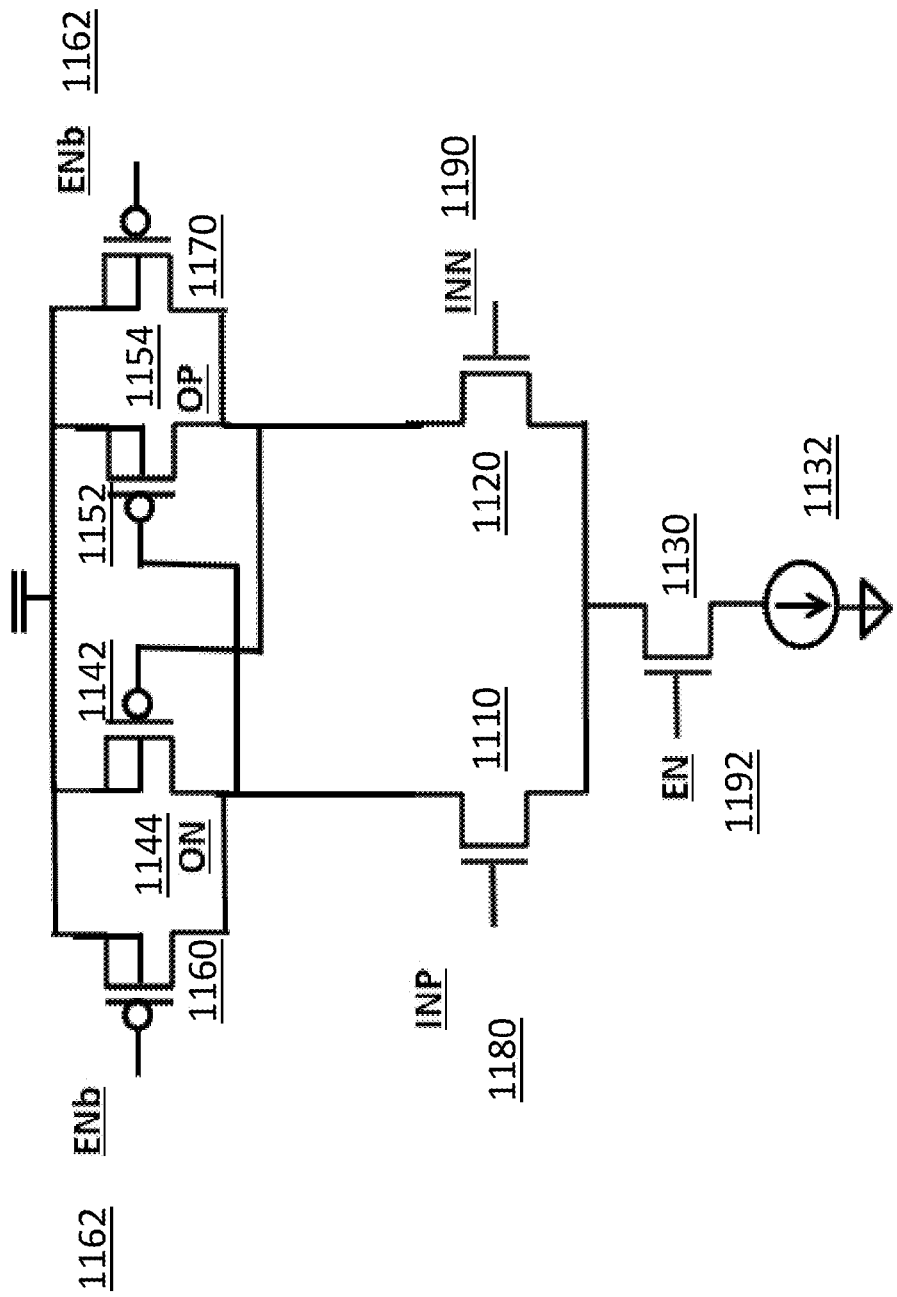
FIG. 13 depicts another embodiment of a comparator circuit for use with a flash memory array sensing.
Figure 14:
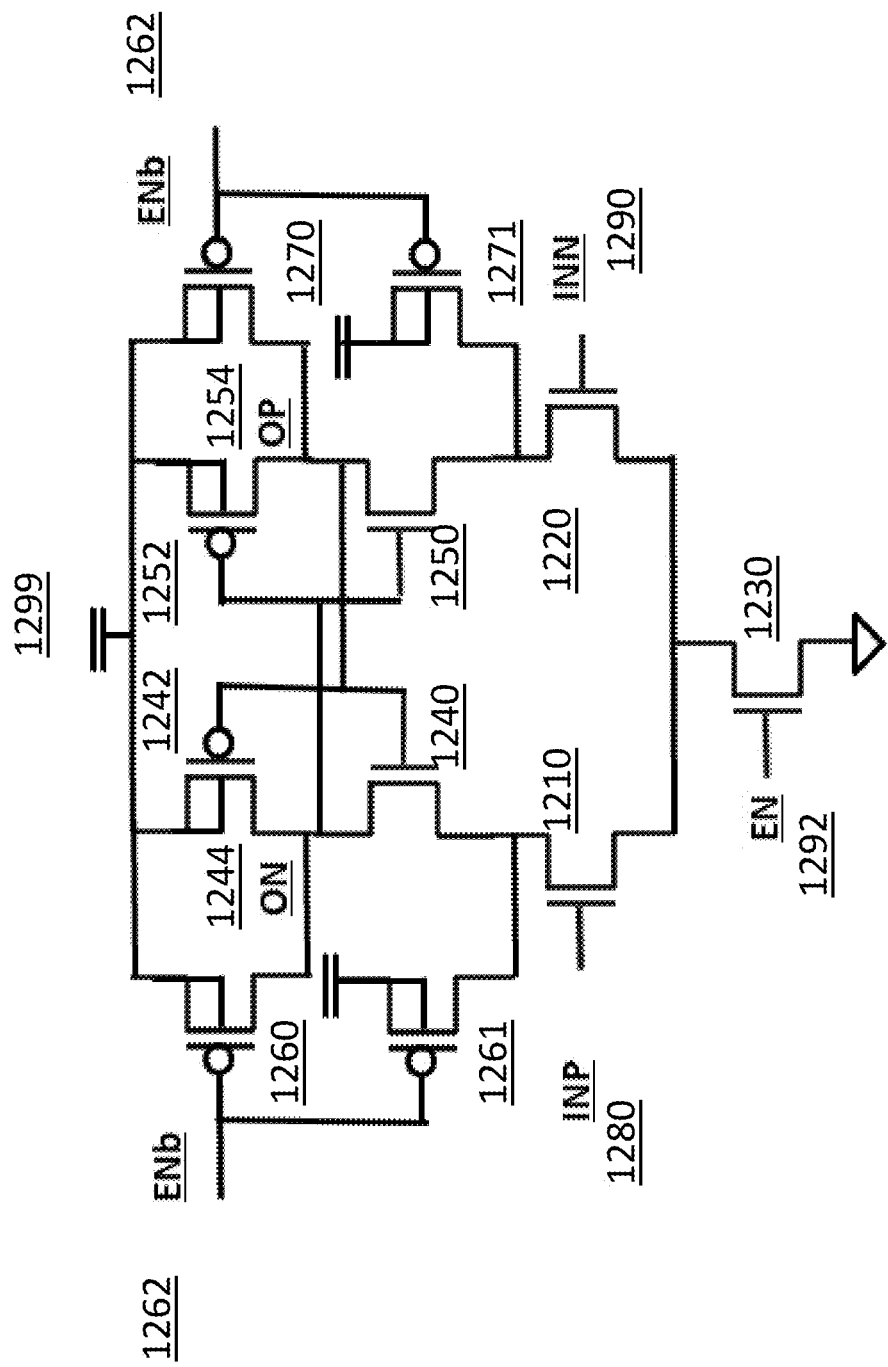
FIG. 14 depicts another embodiment of a comparator circuit for use with a flash memory array sensing.
Figure 15:
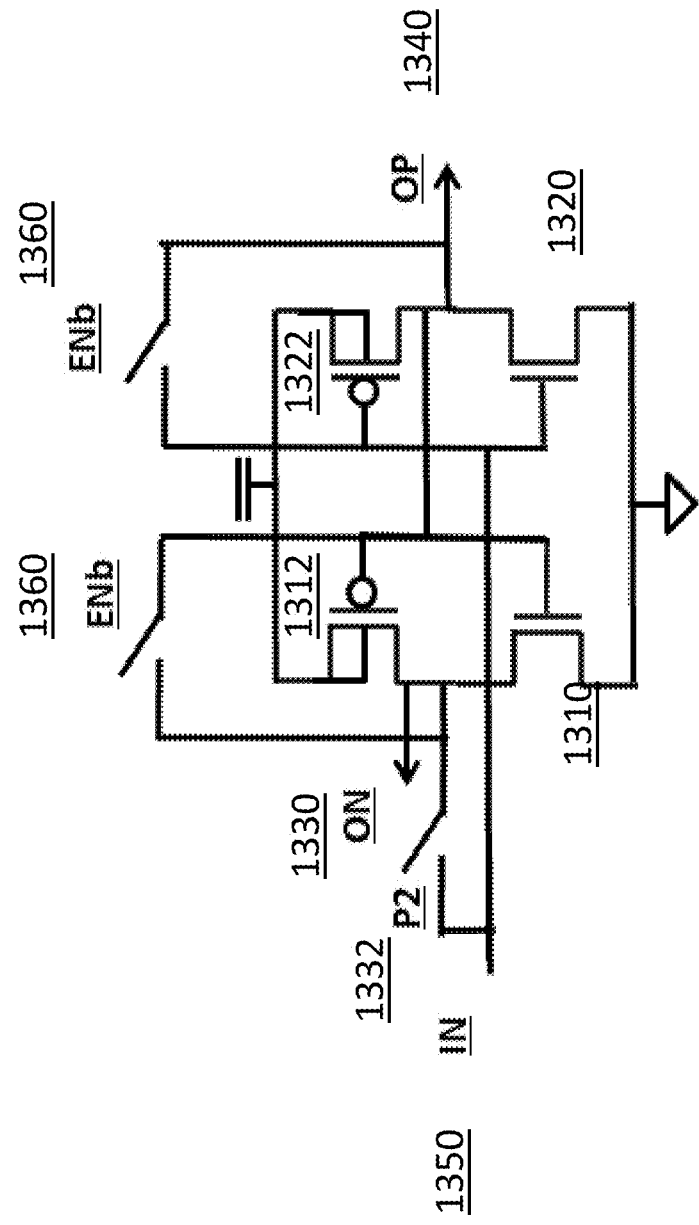
FIG. 15 depicts another embodiment of a comparator circuit for use with a flash memory array sensing.

With reference to FIG. 12, another embodiment of a comparator is depicted. Comparator circuit 1000 includes a cross coupled inverter pair NMOS 1030/PMOS 1032 and NMOS 1040/PMOS 1042 with its high power supply provided by a PMOS transistor 1050 to VDD enabled by enabling signal 1070. It includes a input NMOS pair 1010 and 1020 with respective enabling gates 1060 and 1070 and respective drains connected to the outputs of inverter 1030/1032 and 1040/1042 respectively. The signals to gates of the NMOS transistors 1010 and 1020 are provided such as from sensed node and reference node from previous figures. The transistor 1050 is enabled during the sensing phase. The cross coupled inverter pair provides full VDD and GND level at outputs, With reference to FIG. 13, another embodiment of a comparator is depicted. Comparator circuit 1100 includes a cross coupled pair PMOS 1142 and PMOS 1152 connected to VDD on their sources. It includes an input pair NMOS 1110 and NMOS 1120 with inputs 1180 and 1190 on their gates respectively. The input pair 1110 and 1120 coupled their drains (outputs of the comparator 1100) to the drains of the cross coupled pair 1142 and 1152 respectively. The source of the input pair 1110/1120 is coupled to a bias current 1132 through an NMOS 1130. The input signals to gates of the NMOS transistors 1010 and 1020 are provided such as from sensed node and reference node from previous figures. The transistor 1160 and 1170 precharge the outputs to VDD and is turned off during the sensing phase. The cross coupled PMOS pair 1142/1152 provides full VDD level at outputs, With reference to FIG. 14, another embodiment of a comparator is depicted. Comparator circuit 1200 includes a cross coupled inverter pair NMOS 1240/PMOS 1242 and NMOS 1250/PMOS 1252 connected to VDD on their high power supply. It includes an input NMOS pair 1210 and 1220 with inputs 1280 and 1290 on their gates respectively. The input pair 1210 and 1220 couple their drains to the sources of the cross coupled pair NMOS 1240/1250 respectively. The source of the input pair 1210/1220 is coupled to GND through a NMOS 1230. The outputs 1244 and 1254 of the cross coupled inverter pair 1240/1242 and 1250/1252 are the outputs of the comparator 1200. The input signals to gates of the NMOS transistors 1210 and 1220 are provided such as from sensed node and reference node from previous figures. The transistor 1260 and 1270 precharge the outputs to VDD and are turned off during the sensing phase. The transistor 1261 and 1271 precharge the drains of the input pair 1210 and 1220 to VDD and are turned off during the sensing phase. The cross coupled inverter pair 1240/1242 and 1250/1252 provides full VDD/GND level at outputs, With reference to FIG. 15, another embodiment of a comparator is depicted. Comparator circuit 1300 includes a cross coupled inverter pair NMOS 1310/PMOS 1312 and NMOS 1320/PMOS 1322 connected to VDD on their high power supply and connected to GND on their low power supply and with the output of the second inverter 1310/1312 coupled to the inputs of the inverter 1320/1322 through a switch 1332. It includes switches 1360 to equalize the input to the output of the inverters. During precharge the switches 1360 are turned on and switch 1332 is off and during sensing the switches 1360 are off and the switch 1332 is on to create positive feedback path to accelerate the sensing.

Figure 16:
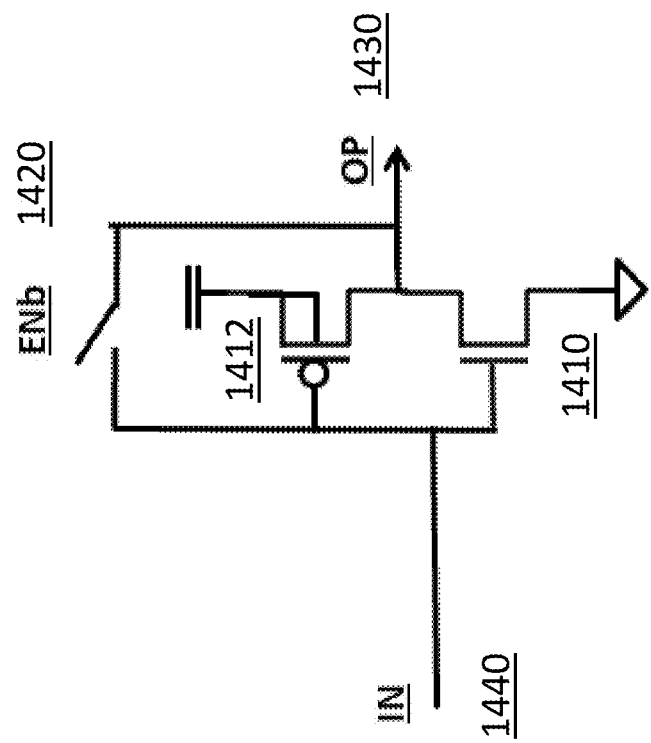
FIG. 16 depicts another embodiment of a comparator circuit for use with a flash memory array sensing.

With reference to FIG. 16, another embodiment of a comparator is depicted. Comparator circuit 1400 includes an inverter NMOS 1410/PMOS 1412 connected to VDD on their high power supply and connected to GND on their low power supply. It includes switch 1420 to equalize the input to the output of the inverter. During precharge the switch 1420 is turned on for equalization and during sensing the switch 1420 is off for amplification.

Figure 17:
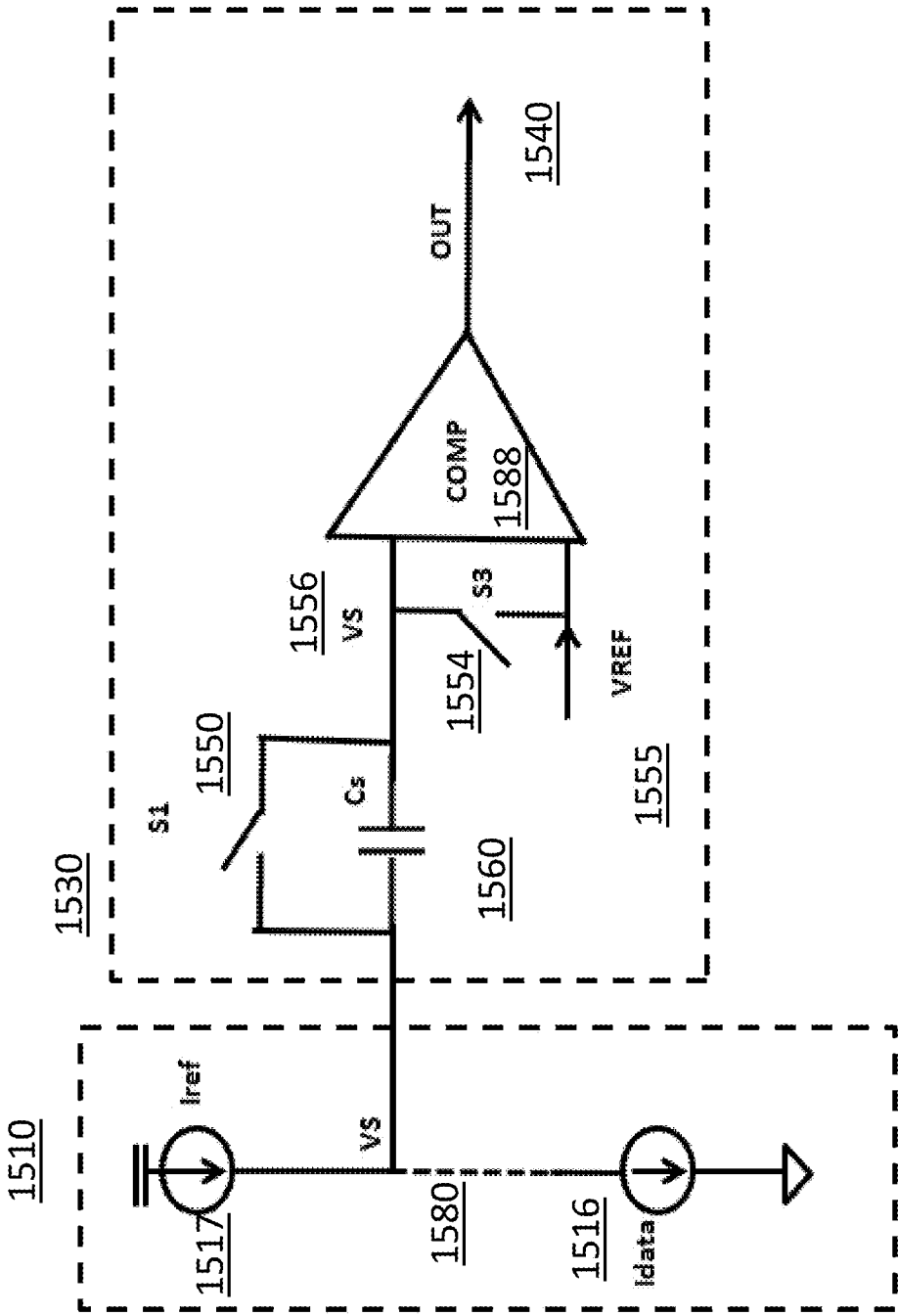
FIG. 17 depicts another embodiment of a sensing circuit for use with a flash memory array sensing.

With reference to FIG. 16, another sensing embodiment is depicted. Sensing circuit 1500 compensates for transistor mismatching and array mismatching. Sensing circuit 1500 comprises memory read block 1510 and differential amplifier block 1530. The devices are connected as shown in FIG. 17. The memory read block 1510 includes a sensed node 1580 coupled to VDD through a reference memory cell current 1527 and coupled to a memory cell current 1516 to ground.

Differential amplifier block 1530 is decoupled from memory read block 1510. Specifically, differential amplifier block 1530 is connected to capacitor 1560, which in turn is connected to memory read block 1510. This enables the system to operate the differential amplifier block 1530 at bias level independent of memory read block 1510. The differential amplifier block 1530 includes a comparator 1588 with its output 1540 and a switch 1554 to initialize the comparator 1588. One terminal of the differential amplifier block 1530 couples to terminal of the capacitor 1560. The other terminal of the differential amplifier block 1530 couples to a read reference bias level 1555.

During a precharge phase, switches 1550 and 1554 are turned on prior to the sensing operation. This ensures that the portion of differential amplifier block 1530 coupled to capacitor 1560 is charged to a same bias level as that of the sensed node 1580. This can be considered an act of initialization/autozero for differential amplifier block 1530.

During the sensing phase, switches 1550 and 1554 are turned off. The voltage at sensed node 1580 will go up slowly if the selected memory cell is storing a "0," and it will go down faster and even further if the selected memory cell is storing a "1." The differential amplifier 1530 will then compare the sensed node 1580 coupling to node 1556 through the capacitor 1560 versus the reference bias node 955, and the result will emerge at output 1540. If selected memory cell stores a "0," then output 1540 will be low. If selected memory cell stores a "1," then output 1540 will be high.

One benefit of this embodiment is that transistor mismatching is alleviated through the use of a common initial state within differential amplifier 1530 established through the precharge phase and the decoupling enabled by capacitor 1560. In addition, the decoupling allows memory read block 1510 to use a higher bit line current than would be possible without the decoupling. The comparator 1588 can be implemented as a singled ended comparator instead of differential comparator configuration.

Figure 18:
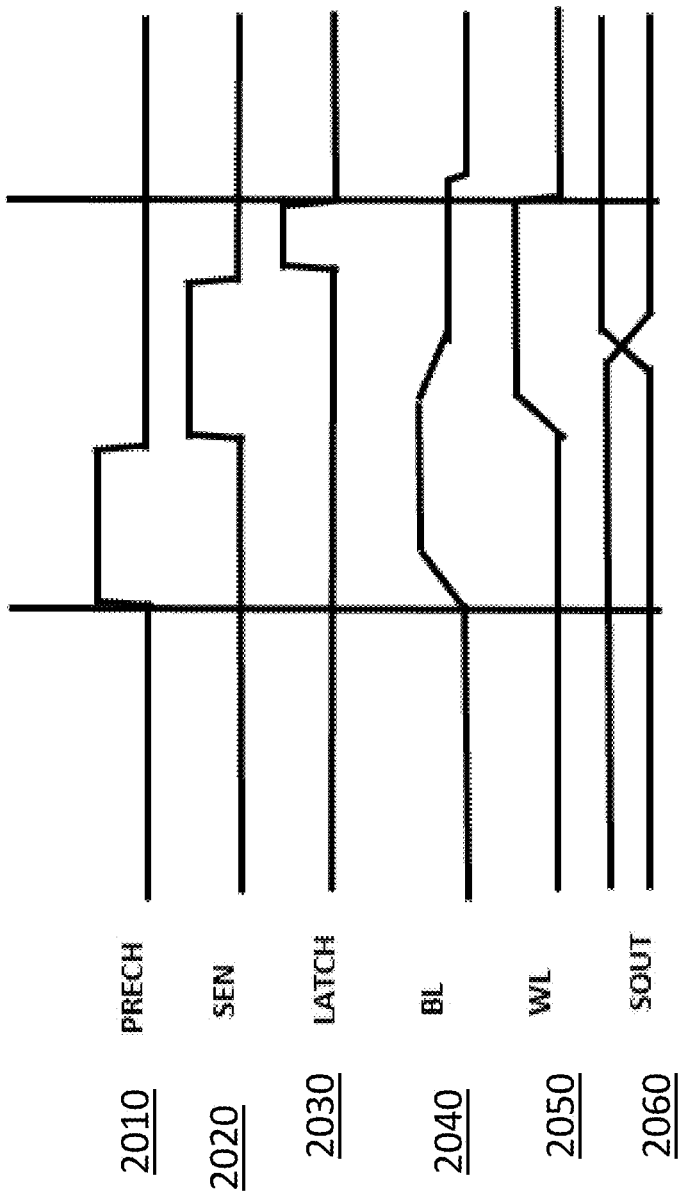
FIG. 18 depicts an embodiment of a sensing sequence for use with a flash memory array sensing.

With reference to FIG. 18, an embodiment of a sensing sequence is depicted. Signal PRECH 2010 is used for precharging and equalization. Signal SEN 2020 is to for sensing phase. Signal LATCH 2030 is used to latch the sensing output. Signal BL 2040 is bitline waveform of selected memory cell, that shows equal to ~VDD during precharging and settling down to a level during sensing phase with high/low level and high/low ramp rate depending on erased or programmed state respectively. Signal WL 2050 is wordline waveform of the selected memory cell that shows equal to 0 v during precharge and equals to a voltage level during sensing. WL 2050 is shown to be enabled (ramp up) after precharging to reduce power consumption during precharging. The WL 2050 is equals to 0V after latching phase. Signal SOUT 2060 is the sensing output of the sensing operation, equals to 1/0 corresponding to erased/programmed states.

Singled amplifier instead of differential amplifiers are implemented in previous figures in alternative embodiments.

Reference replica bias replacing reference memory current for sensing are realized in alternative embodiments. The reference replica bias can be realized from a band gap, a resistance, a MOS device, a bipolar device, etc. with different desired temperature coefficients and/or with different chip characteristics and product specification.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A sensing circuit for use in a memory device, comprising:
    a memory data read block for sensing a selected memory cell;
    a memory reference read block for sensing a reference memory cell;
    a differential amplifier block comprising a first capacitor comprising a first terminal and a second terminal, a second capacitor comprising a first terminal and a second terminal, a precharge circuit for charging the second terminal of the first capacitor and the second terminal of the second capacitor prior to a sensing operation, and an output;
    wherein the first terminal of the first capacitor is connected to the memory data read block and the second terminal of the first capacitor is connected to the differential amplifier block and the first terminal of the second capacitor is connected to the memory reference read block and the second terminal of the second capacitor is connected to the differential amplifier block;
    wherein during the sensing operation the output of the differential amplifier block indicates a value stored in the selected memory cell.

2. The sensing circuit of claim 1, wherein the selected memory cell is a split gate flash memory cell.

3. The sensing circuit of claim 2, wherein the reference memory cell is a split gate flash memory cell.

4. The sensing circuit of claim 1, wherein the precharge circuit comprises a plurality of switches that turn on before the sensing operation and turn off during the sensing operation.

5. The sensing circuit of claim 4, wherein one of the plurality of switches when turned on connects a sensed node of the memory data read block to a voltage source.

6. The sensing circuit of claim 5, wherein one of the plurality of switches when turned on connects a sensed node of the memory reference read block to a voltage source.

7. The sensing circuit of claim 1, wherein the memory data read block comprises a current source, a cascading sensing NMOS transistor, a bitline clamp NMOS transistor, and a diode connected sensing load PMOS transistor.

8. The sensing circuit of claim 7, wherein the memory reference read block comprises a current source, a reference bitline clamp NMOS transistor, a cascading sensing NMOS transistor, and a diode connected sensing load PMOS transistor.

9. The sensing circuit of claim 8, wherein the differential amplifier block further comprises input differential pair NMOS transistors, current mirror load PMOS transistors, and output PMOS transistor, a current bias NMOS transistor, and an output current bias NMOS transistor.

10. The sensing circuit of claim 1, wherein the differential amplifier includes a cross coupled inverter pair in the differential input path.

11. The sensing circuit of claim 1, wherein the memory reference read block supplies a replica reference bias.

12. A method of determining the value stored in a selected memory cell, comprising:
    precharging a first terminal of a first capacitor and a first terminal of a second capacitor using a precharge circuit;
    sensing a selected memory cell at a sensed node using a memory data read block;
    sensing a reference memory cell at a reference node using a memory reference read block;
    comparing the sensed node and the reference node using the differential amplifier block, the differential amplifier block comprising the first capacitor, the second capacitor, and an output, and wherein a second terminal of the first capacitor is connected to the memory data read block and the first terminal of the first capacitor is connected to the differential amplifier block and a second terminal of the second capacitor is connected to the memory reference read block and the first terminal of the second capacitor is connected to the differential amplifier block; and
    indicating at the output of the differential amplifier block a value stored in the selected memory cell.

13. The method of claim 12, wherein the selected memory cell is a split gate flash memory cell.

14. The method of claim 13, wherein the reference memory cell is a split gate flash memory cell.

15. The method of claim 12, wherein the precharge circuit comprises a plurality of switches, and wherein the precharging step comprises turning on the plurality of switches.

16. The method of claim 15, wherein the precharging step comprises connecting the sensed node of the memory data read block to a voltage source.

17. The method of claim 16, wherein precharging step further comprises connecting the sensed node of the reference read block to a voltage source.

18. The method of claim 12, wherein the memory data read block comprises a current source, a cascading sensing NMOS transistor, a bitline clamp NMOS transistor, and a diode connected sensing load PMOS transistor.

19. The method of claim 18, wherein the memory reference read block comprises a current source, a reference bitline clamp NMOS transistor, a cascading sensing NMOS transistor, and a diode connected sensing load PMOS transistor.

20. The method of claim 19, wherein the differential amplifier block further comprises input differential pair NMOS transistors, current mirror load PMOS transistors, an output PMOS transistor, a current bias NMOS transistor, and an output current bias NMOS transistor.

21. A method of determining a value stored in a selected memory cell, comprising:
   precharging a first terminal of a first capacitor and a first terminal of a second capacitor using a precharge circuit;
   sensing a selected memory cell at a sensed node using a memory data read block;
   sensing a reference memory cell at a reference node using a memory reference read block;
   comparing the sensed node and the reference node during a ramping period using the differential amplifier block, the differential amplifier block comprising the first capacitor, the second capacitor, and an output, wherein a second terminal of the first capacitor is connected to the memory data read block and the first terminal of the first capacitor is connected to the differential amplifier block and a second terminal of the second capacitor is connected to the memory reference read block and the first terminal of the second capacitor is connected to the differential amplifier block; and
   indicating at the output of the differential amplifier block the value stored in the selected memory cell.

22. The method of claim 21, wherein the selected memory cell is a split gate flash memory cell.

23. The method of claim 21, wherein the sensed node is ramping down in the sensing period.

24. The method of claim 21, wherein the reference node is ramping up in the sensing period.

25. The method of claim 21, wherein the differential amplifier block comprises a comparator.

26. The method of claim 25, wherein the comparator is a single comparator.

* * * * *